(12) United States Patent
Kumar

(10) Patent No.: US 10,938,938 B2
(45) Date of Patent: Mar. 2, 2021

(54) METHODS FOR SELECTIVELY COMPRESSING DATA AND DEVICES THEREOF

(71) Applicant: NetApp, Inc., Sunnyvale, CA (US)

(72) Inventor: Sudhir Kumar, Sunnyvale, CA (US)

(73) Assignee: NETAPP, INC., Sunnyvale, CA (US)

(*) Notice: Subject to any disclaimer, the term of this patent is extended or adjusted under 35 U.S.C. 154(b) by 0 days.

(21) Appl. No.: 16/392,394

(22) Filed: Apr. 23, 2019

(65) Prior Publication Data

US 2020/0344315 A1    Oct. 29, 2020

(51) Int. Cl.
*G06F 15/16* (2006.01)
*H04L 29/08* (2006.01)
*H03M 7/30* (2006.01)

(52) U.S. Cl.
CPC ....... *H04L 67/2828* (2013.01); *H03M 7/6011* (2013.01)

(58) Field of Classification Search
CPC .................. H04L 67/2828; H03M 7/6011

USPC .................................................. 709/203, 247
See application file for complete search history.

(56) References Cited

U.S. PATENT DOCUMENTS

| | | | |
|---|---|---|---|
| 7,564,861 B1 * | 7/2009 | Subbiah | H03M 7/30 370/428 |
| 9,843,702 B1 * | 12/2017 | Wallace | H04N 1/41 |
| 2011/0167173 A1 * | 7/2011 | Bansal | H03M 7/30 709/247 |
| 2020/0169382 A1 * | 5/2020 | Factor | G06F 3/0608 |

* cited by examiner

*Primary Examiner* — Duyen M Doan
(74) *Attorney, Agent, or Firm* — Troutman Pepper Hamilton Sanders LLP (Rochester)

(57) ABSTRACT

Methods, non-transitory computer readable media, and computing devices that assists with selectively compressing data includes identifying data stream characteristics in a received data stream from a client. A data processing operation to perform on the received data stream is determined based on stored compression instructions data obtained using the identified one or more characteristics. The determined data processing operation is performed on the received data stream. The received data stream is performed upon performing the determined data processing operation.

20 Claims, 4 Drawing Sheets

METHODS FOR SELECTIVELY COMPRESSING DATA AND DEVICES THEREOF

FIELD

This technology relates to managing storage system, and particularly, relates to selectively compressing data and devices thereof.

BACKGROUND

By way of example, a network storage system may comprise computer data storage that is connected to a computer network and which enables data access to heterogeneous clients. Typically, a network storage system may process a large amount of Input/Output (I/O) requests and with these requests high availability, speed, and reliability are desirable characteristics. To achieve these desirable characteristics, data stored in the network storage system often is compressed before being transferred to permanent storage.

However, compressing data consumes processor cycles when the data is compressed at the time that the data arrives at the network storage system. Accordingly, when too many processing cycles are used to compress the data that actually is not compressible, the performance of processing the I/O requests may be affected, and the excess cycles used in compressing the data may negatively affect the desirable characteristics overall performance of the network storage device.

DETAILED DESCRIPTION

Figure 1:
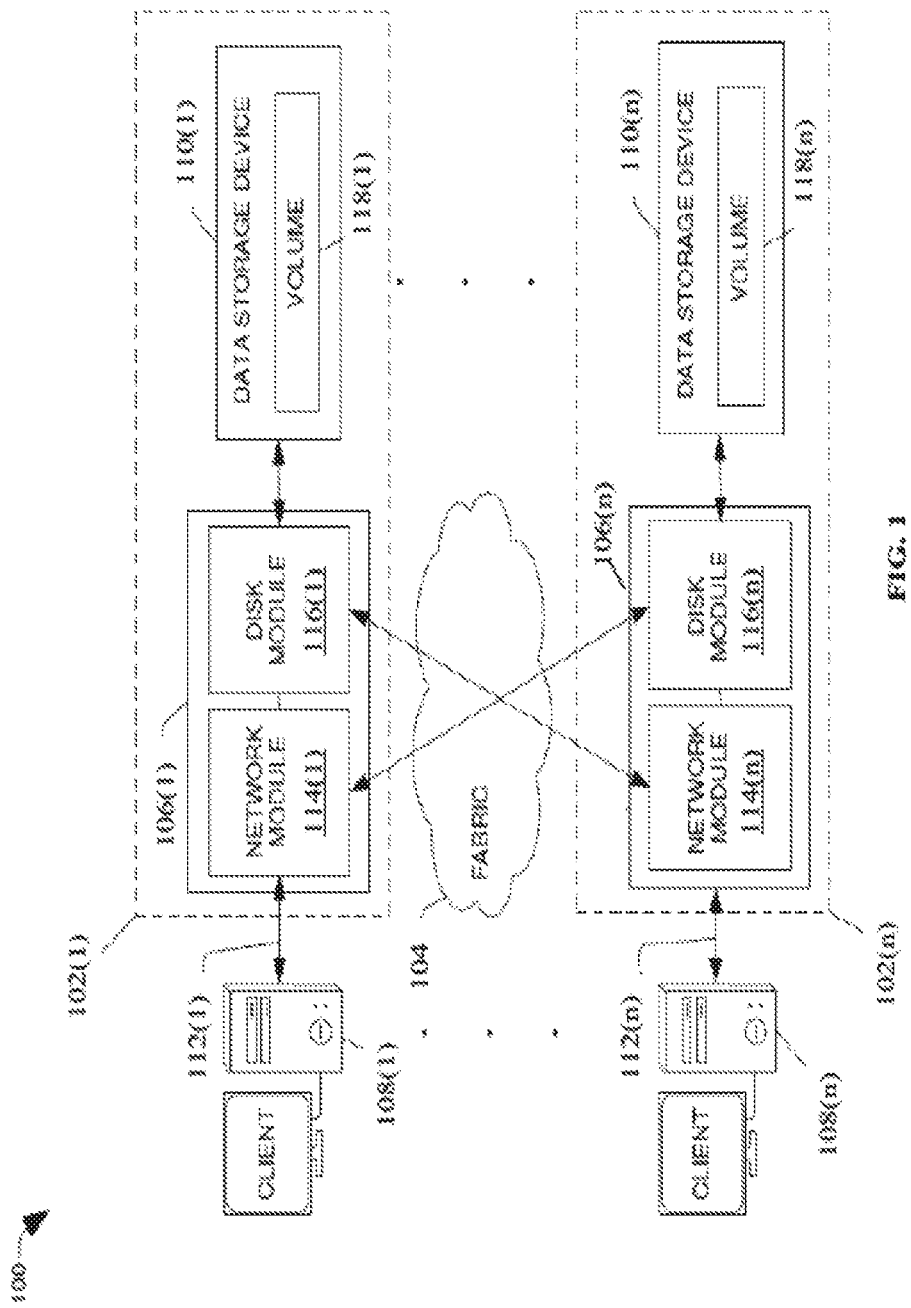
FIG. 1 is a block diagram of a network environment with exemplary data storage apparatuses each including a node computing device.

A clustered network environment 100 that may implement one or more aspects of the technology described and illustrated herein is shown in FIG. 1. The clustered network environment 100 includes data storage apparatuses 102(1)-102(n) that are coupled over a cluster fabric 104 facilitating communication between the data storage apparatuses 102(1)-102(n) (and one or more modules, components, etc. therein, such as, node computing devices 106(1)-106(n), for example), although any number of other elements or components can also be included in the clustered network environment 100 in other examples. This technology provides a number of advantages including methods, non-transitory computer readable media, and devices that assists with selectively compressing data.

In this example, node computing devices 106(1)-106(n) can be primary or local storage controllers or secondary or remote storage controllers that provide client devices 108(1)-108(n), with access to data stored within data storage devices 110(1)-110(n). The data storage apparatuses 102(1)-102(n) and/or node computing device 106(1)-106(n) of the examples described and illustrated herein are not limited to any particular geographic areas and can be clustered locally and/or remotely. Thus, in one example the data storage apparatuses 102(1)-102(n) and/or node computing device 106(1)-106(n) can be distributed over a plurality of storage systems located in a plurality of geographic locations; while in another example a clustered network can include data storage apparatuses 102(1)-102(n) and/or node computing device 106(1)-106(n) residing in a same geographic location (e.g., in a single onsite rack).

In the illustrated example, one or more of the client devices 108(1)-108(n), which may be, for example, personal computers (PCs), computing devices used for storage (e.g., storage servers), and other computers or peripheral devices, are coupled to the respective data storage apparatuses 102(1)-102(n) by storage network connections 112(1)-112(n). Network connections 112(1)-112(n) may include a local area network (LAN) or wide area network (WAN), for example, that utilizes Network Attached Storage (NAS) protocols, such as a Common Internet File System (CIFS) protocol or a Network File System (NFS) protocol to exchange data packets, a Storage Area Network (SAN) protocol, such as Small Computer System Interface (SCSI) or Fiber Channel Protocol (FCP), an object protocol, such as S3, etc.

Illustratively, the client devices 108(1)-108(n) may be general-purpose computers running applications, and may interact with the data storage apparatuses 102(1)-102(n) using a client/server model for exchange of information. That is, the client devices 108(1)-108(n) may request data from the data storage apparatuses 102(1)-102(n) (e.g., data on one of the data storage devices 110(1)-110(n) managed by a network storage control configured to process I/O commands issued by the client devices 108(1)-108(n)), and the data storage apparatuses 102(1)-102(n) may return results of the request to the client devices 108(1)-108(n) via the storage network connections 112(1)-112(n).

The node computing devices 106(1)-106(n) of the data storage apparatuses 102(1)-102(n) can include network or host nodes that are interconnected as a cluster to provide data storage and management services, such as to an enterprise having remote locations, cloud storage (e.g., a storage endpoint may be stored within a data cloud), etc., for example. Such a node computing device 106(1)-106(n) can be a device attached to the fabric 104 as a connection point, redistribution point, or communication endpoint, for example. One or more of the node computing devices 106(1)-106(n) may be capable of sending, receiving, and/or forwarding information over a network communications channel, and could comprise any type of device that meets any or all of these criteria.

In an example, the node computing device 106(1) may be located on a first storage site and the node computing device 106(n) may be located at a second storage site. The node computing devices 106(1) and 106(n) may be configured according to a disaster recovery configuration whereby a surviving node provides switchover access to the storage devices 110(1)-110(n) in the event a disaster occurs at a disaster storage site (e.g., the node computing device 106(1) provides client device 112(n) with switchover data access to storage devices 110(n) in the event a disaster occurs at the second storage site). In other examples, the node computing device 106(n) can be configured according to an archival configuration and/or the node computing devices 106(1)-106(n) can be configured based on another type of replication arrangement (e.g., to facilitate load sharing). Additionally, while two node computing devices are illustrated in FIG. 1, any number of node computing devices or data storage apparatuses can be included in other examples in other types of configurations or arrangements.

As illustrated in the clustered network environment 100, node computing devices 106(1)-106(n) can include various functional components that coordinate to provide a distributed storage architecture. For example, the node computing devices 106(1)-106(n) can include network modules 114(1)-114(n) and disk modules 116(1)-116(n). Network modules 114(1)-114(n) can be configured to allow the node computing devices 106(1)-106(n) (e.g., network storage controllers) to connect with client devices 108(1)-108(n) over the storage network connections 112(1)-112(n), for example, allowing the client devices 108(1)-108(n) to access data stored in the clustered network environment 100.

Further, the network modules 114(1)-114(n) can provide connections with one or more other components through the cluster fabric 104. For example, the network module 114(1) of node computing device 106(1) can access the data storage device 110(n) by sending a request via the cluster fabric 104 through the disk module 116(n) of node computing device 106(n). The cluster fabric 104 can include one or more local and/or wide area computing networks embodied as Infiniband, Fibre Channel (FC), or Ethernet networks, for example, although other types of networks supporting other protocols can also be used.

Disk modules 116(1)-116(n) can be configured to connect data storage devices 110(1)-110(2), such as disks or arrays of disks, SSDs, flash memory, or some other form of data storage, to the node computing devices 106(1)-106(n). Often, disk modules 116(1)-116(n) communicate with the data storage devices 110(1)-110(n) according to the SAN protocol, such as SCSI or FCP, for example, although other protocols can also be used. Thus, as seen from an operating system on node computing devices 106(1)-106(n), the data storage devices 110(1)-110(n) can appear as locally attached. In this manner, different node computing devices 106(1)-106(n), etc. may access data blocks through the operating system, rather than expressly requesting abstract files.

While the clustered network environment 100 illustrates an equal number of network modules 114(1)-114(2) and disk modules 116(1)-116(n), other examples may include a differing number of these modules. For example, there may be a plurality of network and disk modules interconnected in a cluster that do not have a one-to-one correspondence between the network and disk modules. That is, different node computing devices can have a different number of network and disk modules, and the same node computing device can have a different number of network modules than disk modules.

Further, one or more of the client devices 108(1)-108(n) and server devices 109(1)-109(n) can be networked with the node computing devices 106(1)-106(n) in the cluster, over the storage connections 112(1)-112(n). As an example, respective client devices 108(1)-108(n) that are networked to a cluster may request services (e.g., exchanging of information in the form of data packets) of node computing devices 106(1)-106(n) in the cluster, and the node computing devices 106(1)-106(n) can return results of the requested services to the client devices 108(1)-108(n). In one example, the client devices 108(1)-108(n) can exchange information with the network modules 114(1)-114(n) residing in the node computing devices 106(1)-106(n) (e.g., network hosts) in the data storage apparatuses 102(1)-102(n).

In one example, the storage apparatuses 102(1)-102(n) host aggregates corresponding to physical local and remote data storage devices, such as local flash or disk storage in the data storage devices 110(1)-110(n), for example. One or more of the data storage devices 110(1)-110(n) can include mass storage devices, such as disks of a disk array. The disks may comprise any type of mass storage devices, including but not limited to magnetic disk drives, flash memory, and any other similar media adapted to store information, including, for example, data (D) and/or parity (P) information.

The aggregates include volumes 118(1)-118(n) in this example, although any number of volumes can be included in the aggregates. The volumes 118(1)-118(n) are virtual data stores that define an arrangement of storage and one or more file systems within the clustered network environment 100. Volumes 118(1)-118(n) can span a portion of a disk or other storage device, a collection of disks, or portions of disks, for example, and typically define an overall logical arrangement of file storage. In one example volumes 118(1)-118(n) can include stored data as one or more files or objects that reside in a hierarchical directory structure within the volumes 118(1)-118(n). Volumes 118(1)-118(n) are typically configured in formats that may be associated with particular storage systems, and respective volume formats typically comprise features that provide functionality to the volumes 118(1)-118(n), such as providing an ability for volumes 118(1)-118(n) to form clusters.

In one example, to facilitate access to data stored on the disks or other structures of the data storage device 110(1)-110(n), a file system (e.g., write anywhere file system) may be implemented that logically organizes the information as a hierarchical structure of directories and files. In this example, respective files may be implemented as a set of disk blocks configured to store information, whereas directories may be implemented as specially formatted files in which information about other files and directories are stored.

Data can be stored as files or objects within a physical volume and/or a virtual volume, which can be associated with respective volume identifiers, such as file system identifiers (FSIDs). The physical volumes correspond to at least a portion of physical storage devices, such as the data storage device 110(1)-110(n) (e.g., a Redundant Array of Independent (or Inexpensive) Disks (RAID system)) whose address, addressable space, location, etc. does not change. Typically the location of the physical volumes does not change in that the (range of) address(es) used to access it generally remains constant.

Virtual volumes, in contrast, are stored over an aggregate of disparate portions of different physical storage devices. Virtual volumes may be a collection of different available portions of different physical storage device locations, such as some available space from disks, for example. It will be appreciated that since the virtual volumes are not "tied" to any one particular storage device, virtual volumes can be said to include a layer of abstraction or virtualization, which allows them to be resized and/or flexible in some regards.

Further, virtual volumes can include one or more logical unit numbers (LUNs), directories, Qtrees, and/or files. Among other things, these features, but more particularly the LUNS, allow the disparate memory locations within which data is stored to be identified, for example, and grouped as a data storage unit. As such, the LUNs may be characterized as constituting a virtual disk or drive upon which data within the virtual volumes is stored within an aggregate. For example, LUNs are often referred to as virtual disks, such that they emulate a hard drive, while they actually comprise data blocks stored in various parts of a volume.

In one example, the data storage devices 110(1)-110(n) can have one or more physical ports, wherein each physical port can be assigned a target address (e.g., SCSI target address). To represent respective volumes, a target address on the data storage devices 110(1)-110(n) can be used to identify one or more of the LUNs. Thus, for example, when one of the node computing devices 106(1)-106(n) connects to a volume, a connection between the one of the node computing devices 106(1)-106(n) and one or more of the LUNs underlying the volume is created.

In one example, respective target addresses can identify multiple of the LUNs, such that a target address can represent multiple volumes. The I/O interface, which can be implemented as circuitry and/or software in a storage adapter or as executable code residing in memory and executed by a processor, for example, can connect to volumes by using one or more addresses that identify the one or more of the LUNs.

Figure 2:
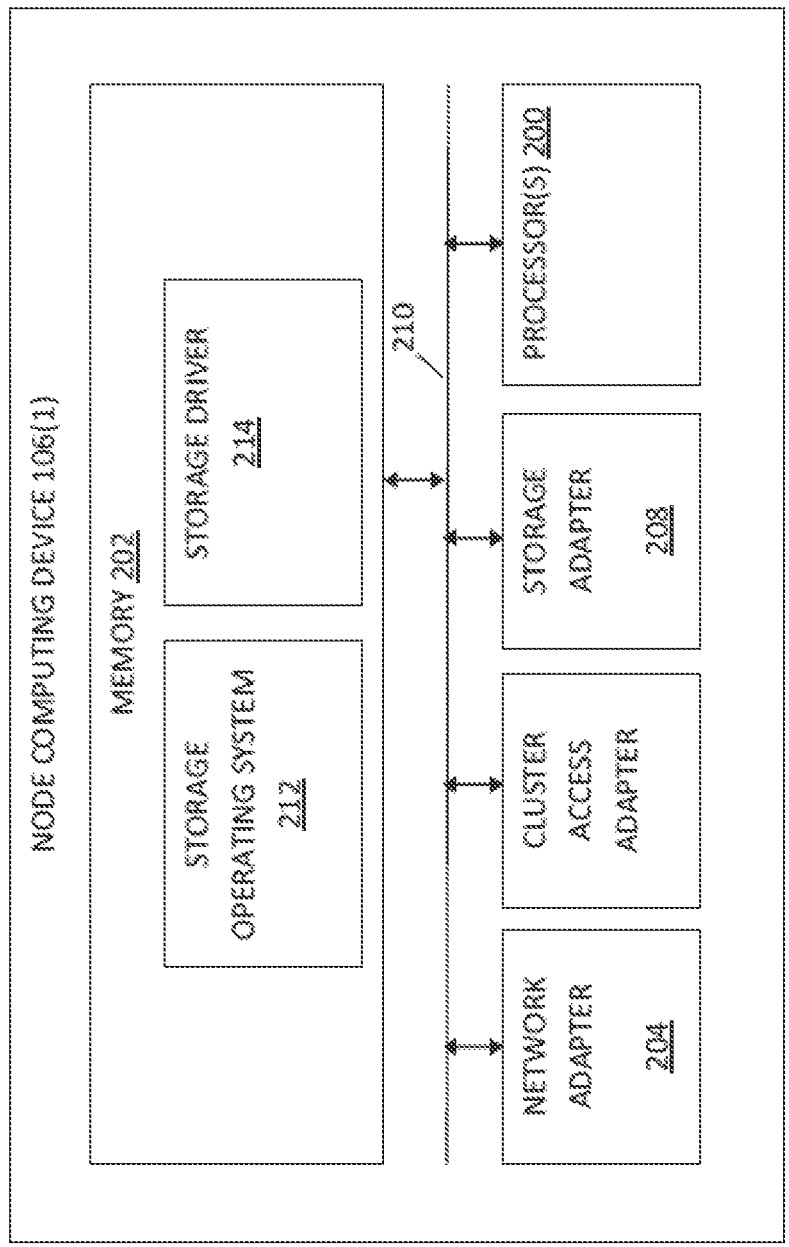
FIG. 2 is a block diagram of an exemplary one of the node computing devices shown in FIG. 1.

Referring to FIG. 2, node computing device 106(1) in this particular example includes processor(s) 200, a memory 202, a network adapter 204, a cluster access adapter 206, and a storage adapter 208 interconnected by a system bus 210. The node computing device 106 also includes a storage operating system 212 installed in the memory 206 that can, for example, implement a Redundant Array of Independent (or Inexpensive) Disks (RAID) data loss protection and recovery scheme to optimize a reconstruction process of data of a failed disk or drive in an array. In some examples, the node computing device 106(n) is substantially the same in structure and/or operation as node computing device 106(1), although the node computing device 106(n) can include a different structure and/or operation in one or more aspects than the node computing device 106(1) in other examples.

The storage operating system 212 can also manage communications for the node computing device 106(1) among other devices that may be in a clustered network, such as attached to a cluster fabric 104. Thus, the node computing device 106(1) can respond to client device requests to manage data on one of the data storage devices 110(1)-110(n) (e.g., or additional clustered devices) in accordance with the client device requests.

The storage operating system 212 can also establish one or more file systems including software code and data structures that implement a persistent hierarchical namespace of files and directories, for example. As an example, when a new data storage device (not shown) is added to a clustered network system, the storage operating system 212 is informed where, in an existing directory tree, new files associated with the new data storage device are to be stored. This is often referred to as "mounting" a file system.

In the example node computing device 106(1), memory 202 can include storage locations that are addressable by the processor(s) 200 and adapters 204, 206, and 208 for storing related software application code and data structures. The processor(s) 200 and adapters 204, 206, and 208 may, for example, include processing elements and/or logic circuitry configured to execute the software code and manipulate the data structures.

The storage operating system 212, portions of which are typically resident in the memory 202 and executed by the processor(s) 200, invokes storage operations in support of a file service implemented by the node computing device 106(1). Other processing and memory mechanisms, including various computer readable media, may be used for storing and/or executing application instructions pertaining to the techniques described and illustrated herein. For example, the storage operating system 212 can also utilize one or more control files (not shown) to aid in the provisioning of virtual machines.

Accordingly, the examples may be embodied as one or more non-transitory computer readable media having machine or processor-executable instructions stored thereon for one or more aspects of the present technology, as described and illustrated by way of the examples herein, which when executed by the processor(s) 200, cause the processor(s) 200 to carry out the steps necessary to implement the methods of this technology, as described and illustrated with the examples herein. In some examples, the executable instructions are configured to perform one or more steps of a method, such as one or more of the exemplary methods described and illustrated later with reference to FIG. 3, for example.

The network adapter 204 in this example includes the mechanical, electrical and signaling circuitry needed to connect the node computing device 106(1) to one or more of the client devices 108(1)-108(n) over storage network connections 112(1)-112(n), which may comprise, among other things, a point-to-point connection or a shared medium, such as a local area network. In some examples, the network adapter 204 further communicates (e.g., using TCP/IP) via the fabric 104 and/or another network (e.g. a WAN) (not shown) with cloud storage devices to process storage operations associated with data stored thereon.

The storage adapter 208 cooperates with the storage operating system 212 executing on the node computing device 106(1) to access information requested by one of the client devices 108(1)-108(n) (e.g., to access data on a data storage device 110(1)-110(n) managed by a network storage controller). The information may be stored on any type of attached array of writeable media such as magnetic disk drives, flash memory, and/or any other similar media adapted to store information.

In the exemplary data storage devices 110(1)-110(n), information can be stored in data blocks on disks. The storage adapter 208 can include input/output (I/O) interface circuitry that couples to the disks over an I/O interconnect arrangement, such as a storage area network (SAN) protocol (e.g., Small Computer System Interface (SCSI), iSCSI, hyperSCSI, Fiber Channel Protocol (FCP)). The information is retrieved by the storage adapter 208 and, if necessary, processed by the processor(s) 200 (or the storage adapter 208 itself) prior to being forwarded over the system bus 210 to the network adapter 204 (and/or the cluster access adapter 206 if sending to another node computing device in the cluster) where the information is formatted into a data packet and returned to a requesting one of the client devices 108(1)-108(2) and/or sent to another node computing device attached via the cluster fabric 104. In some examples, a storage driver 214 in the memory 202 interfaces with the storage adapter to facilitate interactions with the data storage devices 110(1)-110(n), as described and illustrated in more detail later with reference to FIG. 3.

Figure 3:
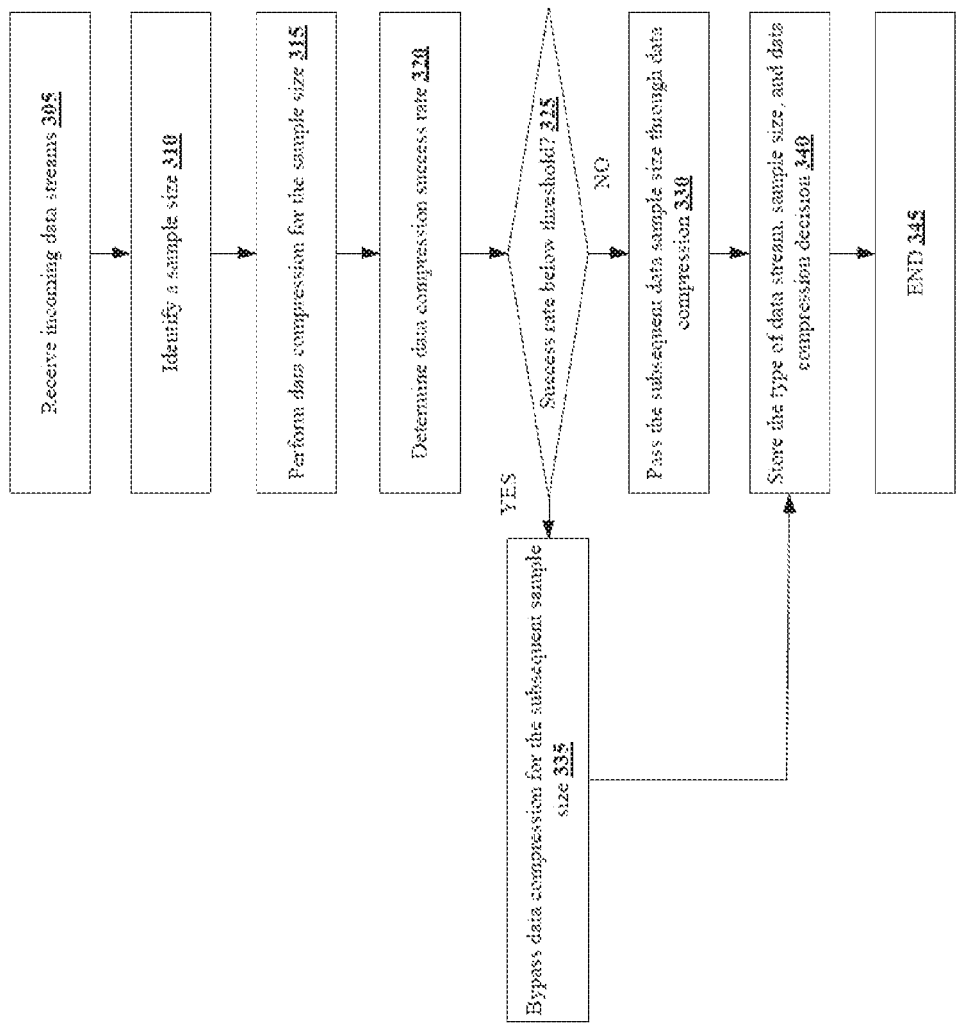
FIG. 3 is a flowchart of an exemplary method for generating data compression instructions.

An exemplary method for generating data compression instructions will now be illustrated with reference to FIG. 3. In step 305 in this example, the node computing device 106(1) receives a data stream from one of the plurality of client devices 108(1)-108(n), although the node computing device 106(1) can receive the data streams from other devices. In this example, the data stream relates to segments of data of a specific type or format or size, although the data streams can include other types or amounts of information in other formats. By way of example, data streams can include data in textual format, images, or video, although the data streams can include other examples.

In step 310, the node computing device 106(1) identifies a sample size to compress the received data streams, although the node computing device 106(1) can compress the entire set of the received data streams. By way of example, the sample size can be identified based on the type, format, or size of the received data streams, although the sample size can be identified using other parameters. In this example, the sample size can be 4 MB of data, although other sample sizes can be used.

In step 315, the node computing device 106(1) performs data compression on the identified sample size of the received data stream using Lempel-Ziv-Oberhumer (LZO) lossless data compression algorithm, although the node computing device 106(1) can perform data compression using other techniques including lossy data compression algorithms. By compressing the data streams, the node computing device 106(1) reduces the size of the received data stream, although compression of the data stream can result other types of changes to the data stream.

In step 320, the node computing device 106(1) determines the success rate of the compression performed on the sample size of the received data stream. In this example, the node computing device 106(1) compares the size of the sample size of the received data stream and size of the sample size of the received data stream after compression. A percentage of change in the size gives the success rate of the compression, in this example, although the success rate can be determined used other techniques and parameters.

In step 325, the node computing device 106(1) compares the determined success rate of the compression to a threshold success rate to determine if the determined success rate is less than the threshold success rate. In this example, the threshold success rate can be set based on type, format, or size of the data stream, although the threshold success rate can be adjusted using other parameters. In this example, if the determined success rate of the compression is not less than the threshold success rate, then the No branch is taken to step 330.

In step 330, the node computing device 106(1) passes the subsequent data stream of the sample size identified in step 310, with the same type, format, or size, through the data compression process illustrated in step 315. In this example, different compression chunk sizes, compression algorithm can be chosen based on the success rate of each sample.

However, back in step 325, if the node computing device 106(1) determines that the determined success rate is less than the threshold success rate, then the Yes branch is taken to step 335.

In step 335, the node computing device 106(1) bypasses the subsequent data stream of the sample size identified in step 310, with the same type, format, or size, through the data compression process illustrated in step 315. In other words, the node computing device 106(1) does not apply the data compression process applied in step 315 to the subsequent data stream of the sample size identified in step 310, with the same type, format, or size, through the data compression process illustrated in step 315. By avoiding performing data compression when the success rate is less than the threshold success rate, the disclosed technology is able to avoid the processing cycles required to perform data compression thereby increasing the performance of the node computing device 106(1). Additionally in this example, the storage savings loss are upper bound by the sample size.

In step 340, the node computing device 106(1) stores the instruction data associated with the received data stream, the identified sample size, and the decision regarding whether the subsequent data stream was passed or bypassed through the data compression process within the volume 108(1), although the node computing device 106(1) can store the data at other memory locations. Additionally in this example, the sample size increases with the increase with the success history. However, if the sample size has been growing due to success rate and immediately a failure is encountered, the sample size is reset to default. The exemplary method ends at step 345.

Figure 4:
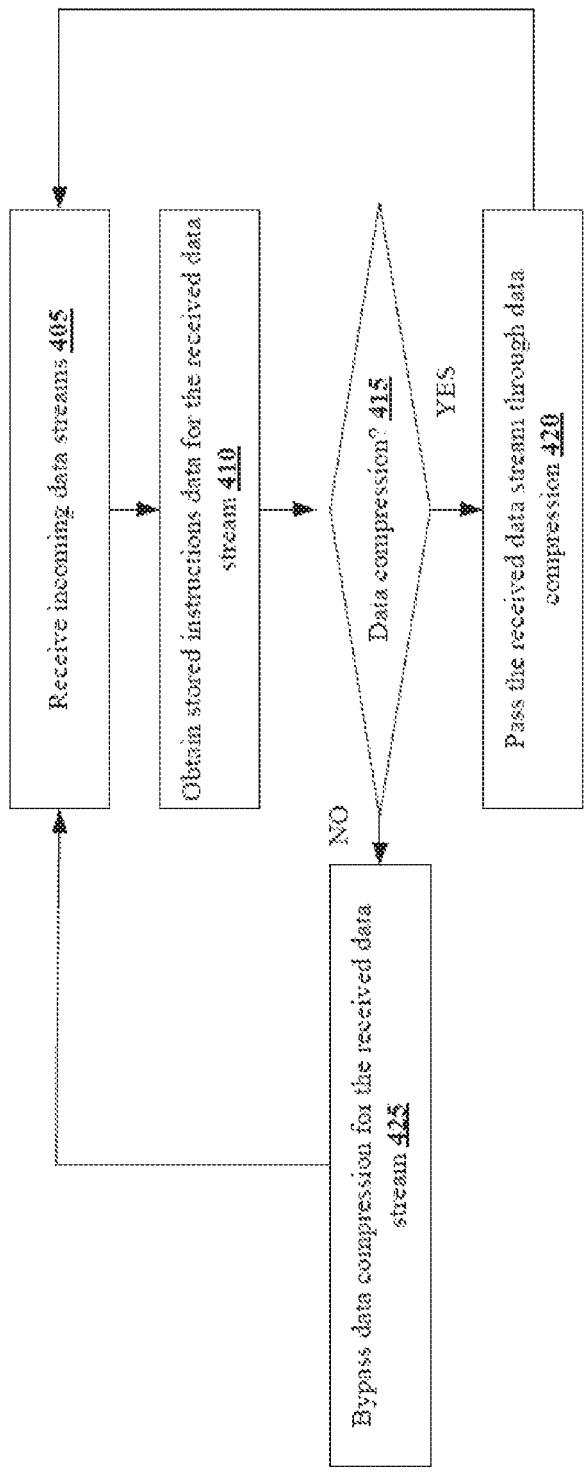
FIG. 4 is a flowchart of an exemplary method for selectively compressing data using the generated data compression instructions.

An example of a method for selectively compressing data using the stored data compression instructions now be illustrated and described with reference to FIG. 4. In step 405, the node computing device 106(1) receives a data stream from one of the plurality of client devices 108(1)-108(n), although the node computing device 106(1) can receive data streams from other devices.

Next in step 410, the node computing device 106(1) obtains the stored compression instruction data for the size, type, or format of the received data streams, although the node computing device 106(1) can receive other types or amounts of information. In this example, the stored instruction data was stored in step 340 of FIG. 3, although the stored compression instruction data can include other types or amounts of information.

In step 415, the node computing device 106(1) determines when the data compression is required to be applied on the received data stream using the obtained compression instruction data. In this example, when the node computing device 106(1) determines that data compression process illustrated in step 315 is required to be applied, then the Yes branch is taken to step 420.

In step 420, the node computing device 106(1) applies the data compression technique illustrated in step 315 on the received data stream and the exemplary flow may proceed back to step 405 where the next received data stream is process. However, if back in step 415, the node computing device 106(1) determines that the data compression should be bypassed, then the No branch is taken to step 425.

In step 425, the node computing device 106(1) bypasses the data compression process illustrated above in step 325. Finally, compressed or uncompressed data stream is transmitted back to the client 108(1), although the data stream can be sent to other devices. By using the stored compression instruction data illustrated in FIG. 3, the disclosed technology is able to selective apply the data compression on specific data streams. By using the above illustrated technique, the disclosed technology is able to significantly reduce numerous processing cycles that are wasted on applying data compression on data streams that has minimal to no change due to the data compression.

Having thus described the basic concept of the technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the technology. Additionally, the recited order of processing elements or sequences, or the use of numbers, letters, or other designations therefore, is not intended to limit the claimed processes to any order except as may be specified in the claims. Accordingly, the technology is limited only by the following claims and equivalents thereto.

What is claimed is:

1. A method, comprising:

determining, by a computing device, when a first compression success rate for a first data stream satisfies a threshold success rate after compressing the first data stream;

storing, by the computing device, a first set of one or more data stream characteristics for the first data stream and a compression instruction to bypass data compression, when the determination indicates the first compression success rate fails to satisfy the threshold success rate;

correlating, by a computing device, a second set of one or more data stream characteristics for a second data stream received after the first data stream with the stored first set of data stream characteristics; and transmitting, by the computing device, the second data stream, without compressing the second data stream based on the compression instruction, when the correlation indicates one or more of the second set of data stream characteristics matches one or more of the stored first set of data stream characteristics.

2. The method as set forth in claim 1, further comprising storing, by the computing device, an additional compression instruction to perform a data processing operation, when the determination indicates the first compression success rate for the first data stream satisfies the threshold success rate.

3. The method as set forth in claim 2, further comprising performing, by the computing device, the data processing operation on an identified sample size of a third data stream, when one or more of a third set of one or more data stream characteristics for the third data stream matches one or more of the stored first set of data stream characteristics.

4. The method as set forth in claim 2, wherein the data processing operation comprises a data compression operation and the method further comprises comparing, by the computing device, a first data size of the first data stream before compressing the first data stream based on the data compression operation and a second data size of the first data stream after compressing the first data stream based on the data compression operation to determine the first compression success rate.

5. The method as set forth in claim 4, further comprising identifying, by the computing device, the first data size based on one or more of the first set of data stream characteristics, wherein the first set of data stream characteristics comprises one or more of a type, a format, or a size of the first data stream.

6. The method as set forth in claim 1, further comprising generating, by the computing device, a second compression success rate for the second data stream, when the correlation indicates the one or more of the second set of data stream characteristics fails to match one or more of the stored first set of data stream characteristics.

7. A non-transitory machine readable medium having stored thereon instructions for compressing data comprising machine executable code which when executed by at least one machine causes the machine to:

determine when a first compression success rate for a first data stream satisfies a threshold success rate after compressing the first data stream;

store a first set of one or more data stream characteristics for the first data stream and a compression instruction to bypass data compression, when the determination indicates the first compression success rate fails to satisfy the threshold success rate;

correlate a second set of one or more data stream characteristics for a second data stream received after the first data stream with the stored first set of data stream characteristics; and transmit the second data stream, without compressing the second data stream based on the compression instruction, when the correlation indicates one or more of the second set of data stream characteristics matches one or more of the stored first set of data stream characteristics.

8. The non-transitory machine readable medium as set forth in claim 7, wherein the executable code, when executed by the machine further causes the machine to store an additional compression instruction perform a data processing operation on, when the determination indicates the first compression success rate for the first data stream satisfies the threshold success rate.

9. The non-transitory machine readable medium as set forth in claim 8, wherein the executable code, when executed by the machine further causes the machine to perform the data processing operation on an identified sample size of a third data stream, when one or more of a third set of one or more data stream characteristics for the third data stream matches one or more of the stored first set of data stream characteristics.

10. The non-transitory machine readable medium as set forth in claim 8, wherein the data processing operation comprises a data compression operation and the executable code, when executed by the machine further causes the machine to identify compare a first data size of the first data stream before compressing the first data stream based on the data compression operation and a second data size of the first data stream after compressing the first data stream based on the data compression operation to determine the first compression success rate.

11. The non-transitory machine readable medium as set forth in claim 10, wherein the executable code, when executed by the machine further causes the machine to identify the first data size based on one or more of the first set of data stream characteristics, wherein the first set of data stream characteristics comprises one or more of a type, a format, or a size of the first data stream.

12. The non-transitory machine readable medium as set forth in claim 7, wherein the executable code, when executed by the machine further causes the machine to generate a second compression success rate for the second data stream, when the correlation indicates the one or more of the second set of data stream characteristics fails to match one or more of the stored first set of data stream characteristics.

13. A computing device, comprising:

a memory device stored thereon machine executable instructions for compressing data; and a processor coupled to the memory device, the processor configured to execute the machine executable instructions to cause the processor to:

determine when a first compression success rate for a first data stream satisfies a threshold success rate after compressing the first data stream;

store a first set of one or more data stream characteristics for the first data stream and a compression instruction to bypass data compression, when the determination indicates the first compression success rate fails to satisfy the threshold success rate;

correlate a second set of one or more data stream characteristics for a second data stream received after the first data stream with the stored first set data stream characteristics; and transmit the second data stream, without compressing the second data stream based on the compression instruction, when the correlation indicates one or more of the second set of data stream characteristics matches one or more of the stored first set of data stream characteristics.

14. The computing device as set forth in claim 13, wherein the processor is further configured to execute the machine executable code to further cause the processor to store an additional compression instruction perform a data processing operation on, when the determination indicates the first compression success rate for the first data stream satisfies the threshold success rate.

15. The computing device as set forth in claim 14, wherein the processor is further configured to execute the machine executable code to further cause the processor to perform the data processing operation on an identified sample size of a third data stream, when one or more of a third set of one or more data stream characteristics for the third data stream matches one or more of the stored first set of data stream characteristics.

16. The computing device as set forth in claim 14, wherein the data processing operation comprises a data compression operation and the processor is further configured to execute the machine executable code to further cause the processor to compare a first data size of the first data stream before compressing the first data stream based on the data compression operation and a second data size of the first data stream after compressing the first data stream based on the data compression operation to determine the first compression success rate.

17. The computing device as set forth in claim 16, wherein the processor is further configured to execute the machine executable code to further cause the processor to identify the first data size based on one or more of the first set of data stream characteristics, wherein the first set of data stream characteristics comprises one or more of a type, a format, or a size of the first data stream.

18. The computing device as set forth in claim 13, wherein the processor is further configured to execute the machine executable code to further cause the processor to generate a second compression success rate for the second data stream, when the correlation indicates the one or more of the second set of data stream characteristics fails to match one or more of the stored first set of data stream characteristics.

19. The computing device as set forth in claim 18, wherein a sample size of the second data stream used to generate the second compression success rate is greater than another sample size of the first data stream used to generate the first compression success rate, when the determination indicates the first compression success rate for the first data stream satisfies the threshold success rate.

20. The computing device as set forth in claim 18, wherein the processor is further configured to execute the machine executable code to further cause the processor to reset a sample size used to generate the first success rate, when the determination indicates the first compression success rate fails to satisfy the threshold success rate, wherein the second compression success rate is generated using the reset sample size.

* * * * *